United States Patent
Sciarrillo

(10) Patent No.: US 9,443,763 B2
(45) Date of Patent: Sep. 13, 2016

(54) METHODS FOR FORMING INTERCONNECTIONS BETWEEN TOP ELECTRODES IN MEMORY CELLS BY A TWO-STEP CHEMICAL-MECHANICAL POLISHING (CMP) PROCESS

(71) Applicant: Micron Technology, Inc., Boise, ID (US)

(72) Inventor: Samuele Sciarrillo, Lomagna (IT)

(73) Assignee: Micron Technology, Inc., Boise, ID (US)

( * ) Notice: Subject to any disclaimer, the term of this patent is extended or adjusted under 35 U.S.C. 154(b) by 325 days.

(21) Appl. No.: 14/025,537

(22) Filed: Sep. 12, 2013

(65) Prior Publication Data
US 2015/0069630 A1 Mar. 12, 2015

(51) Int. Cl.
H01L 21/768 (2006.01)
H01L 45/00 (2006.01)
H01L 27/24 (2006.01)

(52) U.S. Cl.
CPC ..... *H01L 21/76895* (2013.01); *H01L 21/7684* (2013.01); *H01L 27/2409* (2013.01); *H01L 27/2427* (2013.01); *H01L 27/2436* (2013.01); *H01L 27/2445* (2013.01); *H01L 27/2463* (2013.01); *H01L 27/2481* (2013.01); *H01L 45/06* (2013.01); *H01L 45/1233* (2013.01); *H01L 45/144* (2013.01); *H01L 45/1675* (2013.01)

(58) Field of Classification Search
None
See application file for complete search history.

(56) References Cited

U.S. PATENT DOCUMENTS

| | | | | |
|---|---|---|---|---|
| 4,481,070 A | * | 11/1984 | Thomas | H01L 21/768419 204/192.32 |
| 5,552,346 A | * | 9/1996 | Huang | H01L 21/31053 257/E21.244 |
| 6,287,879 B1 | * | 9/2001 | Gonzales | B24B 37/013 438/16 |
| 6,344,408 B1 | * | 2/2002 | Chen | H01L 21/3212 257/E21.304 |
| 6,600,229 B2 | * | 7/2003 | Mukherjee | C23F 3/06 257/752 |
| 6,709,874 B2 | | 3/2004 | Ning | |
| 6,906,940 B1 | | 6/2005 | Lue | |
| 7,435,648 B2 | | 10/2008 | Hsu et al. | |

(Continued)

FOREIGN PATENT DOCUMENTS

| | | |
|---|---|---|
| KR | 1020110001487 A | 1/2011 |
| KR | 1020110123005 A | 11/2011 |
| KR | 1020120094339 A | 8/2012 |

OTHER PUBLICATIONS

Bez, "Phase Change Memory: State of the Art and Perspective," 11th Leti Annual Review, Jun. 22-24, 2009, 34 pp.

(Continued)

*Primary Examiner* — Marc Armand
*Assistant Examiner* — Younes Boulghassoul
(74) *Attorney, Agent, or Firm* — Brooks, Cameron & Huebsch, PLLC

(57) ABSTRACT

Memory cell array architectures and methods of forming the same are provided. An example method for forming an array of memory cells can include forming a plurality of vertical structures each having a switch element in series with a memory element in series with a top electrode, and forming an interconnection conductive material between the respective top electrodes of the plurality of vertical structures. The interconnection conductive material is etched-back and chemical-mechanical polished (CMPed). A conductive line is formed over the interconnection conductive material after CMPing the interconnection conductive material.

27 Claims, 14 Drawing Sheets

(56) References Cited

U.S. PATENT DOCUMENTS

| | | | |
|---|---|---|---|
| 7,888,711 | B2 | 2/2011 | Cheung et al. |
| 7,943,515 | B2 | 5/2011 | Scheuerlein |
| 7,989,789 | B2 | 8/2011 | Toda |
| 8,173,987 | B2 | 5/2012 | Lung |
| 8,188,157 | B2 | 5/2012 | Litke et al. |
| 8,208,279 | B2 | 6/2012 | Lue |
| 8,274,067 | B2 | 9/2012 | Ahn et al. |
| 8,409,915 | B2 | 4/2013 | Smythe et al. |
| 8,416,609 | B2 | 4/2013 | Meade |
| 8,502,184 | B2 | 8/2013 | An et al. |
| 2008/0206994 | A1* | 8/2008 | Feustel ............... H01L 21/3212 438/693 |
| 2008/0304308 | A1 | 12/2008 | Stipe |
| 2009/0097321 | A1 | 4/2009 | Kim et al. |
| 2009/0267042 | A1 | 10/2009 | Happ et al. |
| 2010/0163822 | A1 | 7/2010 | Ovshinsky et al. |
| 2010/0232200 | A1 | 9/2010 | Shepard |
| 2010/0270529 | A1 | 10/2010 | Lung |
| 2010/0270593 | A1 | 10/2010 | Lung |
| 2011/0095257 | A1* | 4/2011 | Xu ..................... H01L 21/02115 257/3 |
| 2011/0147690 | A1 | 6/2011 | Yang |
| 2011/0215394 | A1 | 9/2011 | Komori et al. |
| 2011/0215408 | A1 | 9/2011 | Tang et al. |
| 2011/0215436 | A1* | 9/2011 | Tang ..................... H01L 21/762 257/506 |
| 2011/0278527 | A1 | 11/2011 | Ishibashi |
| 2011/0278528 | A1 | 11/2011 | Lung et al. |
| 2012/0206979 | A1 | 8/2012 | Shin et al. |
| 2012/0235109 | A1* | 9/2012 | Nojiri ................... H01L 27/101 257/4 |
| 2012/0261638 | A1 | 10/2012 | Sills et al. |
| 2013/0009122 | A1 | 1/2013 | Park et al. |
| 2013/0193398 | A1* | 8/2013 | Pellizzer ............ H01L 45/1691 257/5 |

OTHER PUBLICATIONS

Kau et al., "A stackable cross point phase change memory," Electron Devices Meeting (IEDM), 2009 IEEE International, Dec. 7-9, 2009, 4 pp.

Malventano, "Intel and Numonyx announce vertical Phase Change Memory," PC Perspective, Oct. 28, 2009, http://www.pcper.com/news/Storage/Intel-and-Numonyx-announce-vertical-Phase-Change-Memory, 2 pp.

Savage, "Nunnonyx Makes Stackable Phase-Change Memory," IEEE Spectrum, Nov. 17, 2009, http://spectrum.ieee.org/semiconductors/memory/numonyx-makes-stackable-phasechange-memory, 3 pp.

Wong, "Emerging Memories," Department of Electrical Engineering, Stanford University, Stanford, California, Apr. 3, 2008, 77 pp.

Meyer et al., "Oxide Dual-Layer Memory Element for Scalable Non-Volatile Cross-Point Memory Technology" IEEE Technology, Nov. 2008, 5 pp.

Anbarasu et al., "Understanding the Structure and Properties of Phase Change Materials for Data Storage Applications," Journal of the Indian Institute of Science, 91:2, pp. 259-274, Apr.-Jun. 2011.

Lu, NTUEE Electronics, Chapter 3—Diodes, downloaded from http://cc.ee.ntu.edu.tw/~lhlu/eecourses/electronics1/electronics_Ch3.pdf, on Nov. 2, 2013, 14 pp.

U.S. Appl. No. 13/600,699, by Frederico Pio, filed Aug. 31, 2012.

U.S. Appl. No. 13/600,777, by Frederico Pio, filed Aug. 31, 2012.

* cited by examiner

METHODS FOR FORMING INTERCONNECTIONS BETWEEN TOP ELECTRODES IN MEMORY CELLS BY A TWO-STEP CHEMICAL-MECHANICAL POLISHING (CMP) PROCESS

TECHNICAL FIELD

The present disclosure relates generally to semiconductor devices, and more particularly to memory cell architectures and methods of forming the same.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistance variable memory, and flash memory, among others. Types of resistance variable memory include phase change material (PCM) memory, programmable conductor memory, and resistive random access memory (RRAM), among others.

Non-volatile memory is utilized as memory devices for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Constant challenges related to memory device fabrication are to decrease the size of a memory device, increase the storage density of a memory device, reduce power consumption, and/or limit memory device cost. Some memory devices include memory cells arranged in single or multiple deck arrays, in which memory cells are arranged in a single plane, or into multiple planes, e.g., into a three dimensional (3D) array having multiple decks of memory cells.

DETAILED DESCRIPTION

Figure 1:
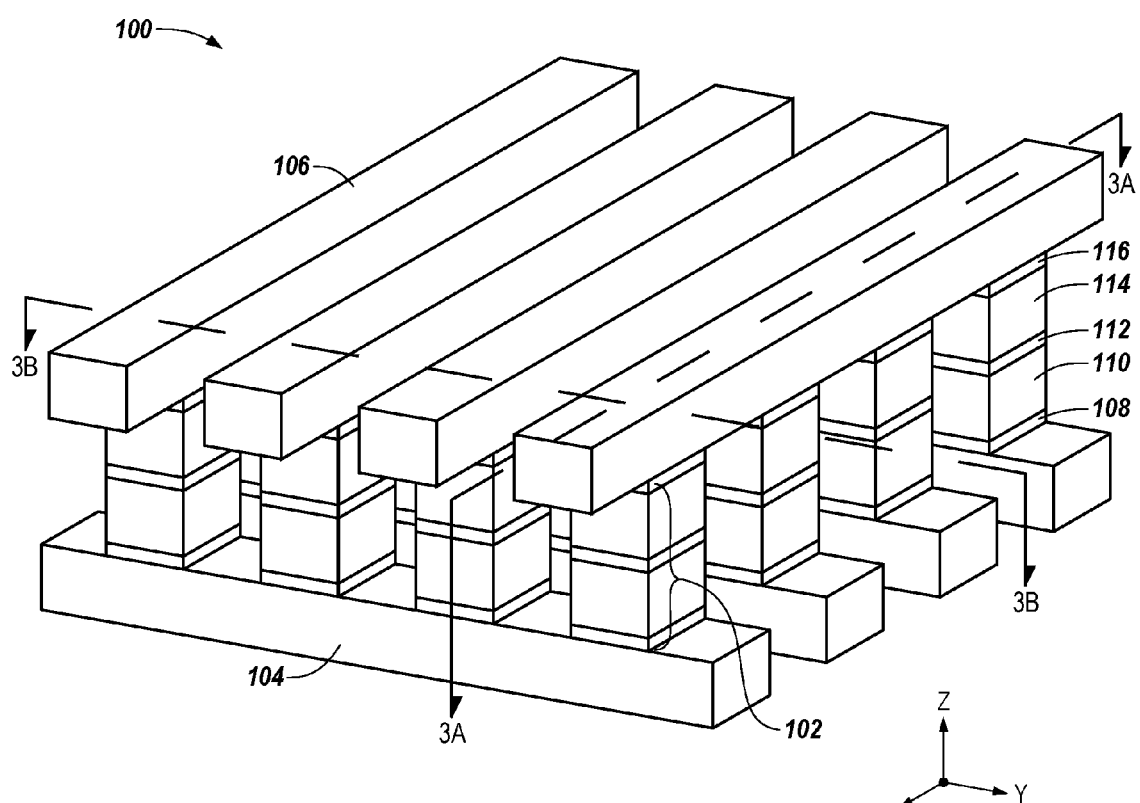
FIG. 1 is a perspective view of a portion of a memory array in accordance with a number of embodiments of the present disclosure.

Memory cell architectures and methods of forming the same are provided. An example method for forming an array of memory cells can include forming a plurality of vertical structures each having a switch element in series with a memory element in series with a top electrode, and forming an interconnection conductive material between the respective top electrodes of the plurality of vertical structures. The interconnection conductive material is etched-back and chemical-mechanical polished (CMPed). A conductive line is formed over the interconnection conductive material after CMPing the interconnection conductive material.

One process step in forming structures of a cross point memory that can impact the quality of subsequent steps is chemical-mechanical polishing (CMPing) performance after fin, pillar, and/or conductive line, e.g., access line (also referred to as a word line) and/or data/sense line (also referred to as bit line), sealing & filling. The quality, e.g., planarity, etc., of the CMPing can propagate to subsequent formation of other structure over the surface(s) CMP'd. Several risks of CMP process during formation of the memory cells include, but are not limited to:

(1) leaving too much material if the CMP is not sufficiently aggressive, e.g., residues of a hard mask above a word line due to insufficient time/pressure/surface contact/etc.

(2) removing too much material if the CMP is too aggressive, e.g., removing part of the top layers of materials that should remain such as the word lines (or the bit lines).

(3) bad planarity, e.g., poorer planarity of a material surface, uneven surface topology.

These risks can result in poorer planarity after the CMP, which in turn can propagate to poorer planarity for conductive line materials formed over the CMP'd surface such as the bit lines (or the word lines) for single deck and double deck process flows.

The following disclosure describes a new process flow. The disclosed process flow is able to achieve better CMP results, including planarity, for single and multiple deck memory cell array configurations. Improved planarity can improve subsequent material formation, e.g., deposition, performance in stack formation, improve control of conductive line formation, e.g., bit line(s) etch performance, and improve integration between conductive lines, e.g., between bit lines. Additionally, improved planarity can improve formation of overlying decks by mitigating conductive line sealing recesses, and by consuming the hard mask while etching vertical structures of the bottom deck. A more even and/or continuous surface can improve CMP results, as can a certain landing and/or stopping location.

The figures herein follow a numbering convention in which the first digit or digits correspond to the drawing figure number and the remaining digits identify an element or component in the drawing. Similar elements or components between different figures may be identified by the use of similar digits. For example, 106 may reference element "06" in FIG. 1, and a similar element may be referenced as 306 in FIG. 3A. Also, as used herein, "a number of" a particular element and/or feature can refer to one or more of such elements and/or features.

As used herein, the term "substantially" intends that the modified characteristic needs not be absolute, but is close enough so as to achieve the advantages of the characteristic. For example, "substantially parallel" is not limited to absolute parallelism, and can include orientations that are at least closer to a parallel orientation than a perpendicular orientation. Similarly, "substantially orthogonal" is not limited to absolute orthogonalism, and can include orientations that are at least closer to a perpendicular orientation than a parallel orientation.

FIG. 1 is a perspective view of a portion of a memory array 100 in accordance with a number of embodiments of the present disclosure. In the example shown in FIG. 1, memory array 100 is a three dimensional (3D) cross point memory array. However, embodiments of the present disclosure are not so limited.

Array 100 can be a cross point memory having memory cells 102 located at the intersections of a number of conductive lines, e.g., access lines 104, which may be referred to herein as word lines, and a number of conductive lines, e.g., data/sense lines 106, which may be referred to herein as bit lines. As illustrated in FIG. 1, word lines 104 can be parallel to each other and can be orthogonal to bit lines 106, which can be parallel or substantially parallel to each other. However, embodiments are not so limited. Word lines 104 and/or bit lines 106 can be a conductive material such as tungsten, copper, titanium, aluminum, and/or other metals, for example. However, embodiments are not so limited. In a number of embodiments, array 100 can be a portion, e.g., a level, of a three-dimensional array, e.g., a multi-level array, (described further with respect to FIG. 2) in which other arrays similar to array 100 are at different levels, for example above and/or below array 100.

Each memory cell 102 can include a memory element 114, e.g., storage element, coupled in series with a respective switch element 110, e.g., selector device, and/or access device. The memory cell can have a number of electrodes adjacent the memory element 114 and switch element 110, including a first, e.g., top, electrode, second, e.g., middle, electrode, and/or third, e.g., bottom, electrode. The memory element 114 can be, for example, a resistive memory element. The memory element 114 can be formed between a pair of electrodes, e.g., first electrode 116 and second electrode 112. The memory element can be comprised of a resistance variable material such as a phase change memory (PCM) material, for example. As an example, the PCM material can be a chalcogenide alloy such as a Germanium-Antimony-Tellurium (GST) material, e.g., Ge—Sb—Te materials such as $Ge_2Sb_2Te_5$, $Ge_1Sb_2Te_4$, $Ge_1Sb_4Te_7$, $Ge_8Sb_5Te_8$, $Ge_4Sb_4Te_7$, etc., or an indium(In)-antimony (Sb)-tellurium(Te) (IST) material, e.g., $In_2Sb_2Te_5$, $In_1Sb_2Te_4$, $In_1Sb_4Te_7$, etc., among other phase change memory materials. The hyphenated chemical composition notation, as used herein, indicates the elements included in a particular mixture or compound, and is intended to represent all stoichiometries involving the indicated elements. Other phase change memory materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. However, embodiments of the present disclosure are not limited to a particular type of PCM material. Further, embodiments are not limited to memory elements comprising PCM materials. For instance, the memory elements can comprise a number of resistance variable materials such as binary metal oxides, colossal magnetoresistive materials, and/or various polymer-based resistive variable materials, among others.

For simplicity, FIG. 1 shows the memory element 114 and the switch element 110 having similar dimensions. However, as is discussed below, a memory cell 102 can be formed with a memory element 114 having different dimension(s), e.g., critical dimension, cross-sectional area, etc., than the switch element 110.

The switch element 110 can be a two terminal device such as a diode, an ovonic threshold switch (OTS), or an ovonic memory switch (OMS). However, embodiments of the present disclosure are not limited to a particular type of switch element 110. For example, the switch element 110 can be a field effect transistor (FET), a bipolar junction transistor (BJT), or a diode, among other types of selector devices. The switch element 110 can be formed between a pair of electrodes, e.g., the second electrode and a third electrode 112 and 108. Although FIG. 1 illustrates a configuration having the memory element 114 formed over the switch element 110, embodiments of the present disclosure are not so limited. According to various embodiments of the present disclosure the switch element 110 can be formed over the memory element 114, for example.

Electrodes 108, 112, and/or 116 can comprise materials such as Ti, Ta, W, Al, Cr, Zr, Nb, Mo, Hf, B, C, conductive nitrides of the aforementioned materials, e.g., TiN, TaN, WN, CN, etc.), and/or combinations thereof.

In a number of embodiments, the switch elements 110 corresponding to memory cells 102 can be OTS's having a chalcogenide selector device material. In such embodiments, the chalcogenide material of the switch element 110 may not actively change phase, e.g., between amorphous and crystalline, such as a chalcogenide resistance variable material of the memory element. Instead, the chalcogenide material of the switch element can change between an "on" and "off" state depending on the voltage potential applied across memory cell 102. For example, the "state" of the OTS can change when a current through the OTS exceeds a threshold current or a voltage across the OTS exceeds a threshold voltage. Once the threshold current or voltage is reached, an on state can be triggered and the OTS can be in a conductive state. In this example, if the current or voltage potential drops below a threshold value, the OTS can return to a non-conductive state.

In a number of embodiments, the memory element 114 can comprise one or more of the same material(s) as the switch element 110. However, embodiments are not so limited. For example, memory element 114 and switch element 110 can comprise different materials.

Memory cells 102 can be programmed to a target data state, e.g., corresponding to a particular resistance state, by applying sources of an electrical field or energy, such as positive or negative electrical pulses, to the cells, e.g., to the storage element of the cells, for a particular duration. The electrical pulses can be, for example, positive or negative voltage or current pulses.

Figure 2:
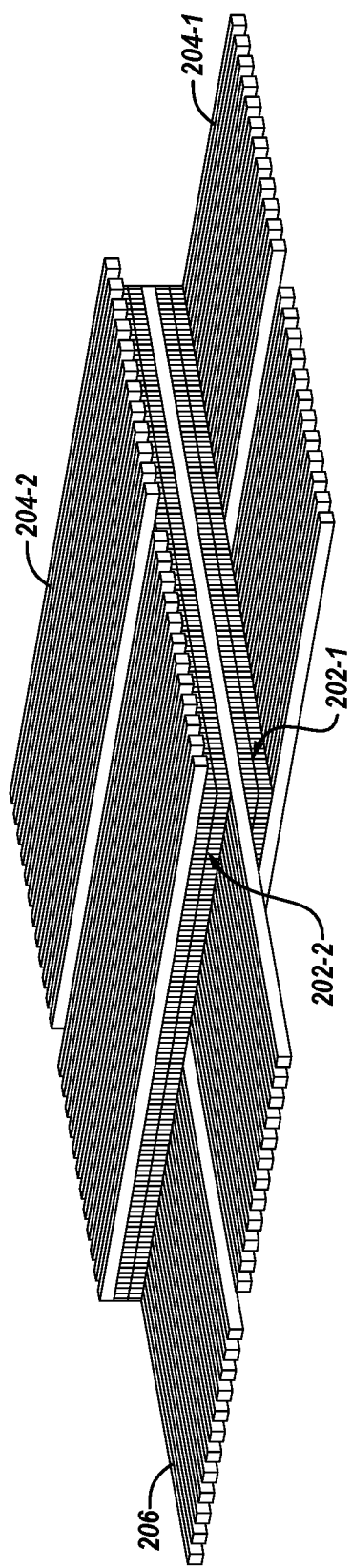
FIG. 2 illustrates a three dimensional memory array in accordance with a number of embodiments of the present disclosure.

FIG. 2 illustrates a three dimensional (3D) memory array in accordance with a number of embodiments of the present disclosure. The 3D memory array comprises a plurality of memory cells 202-1, 202-2, e.g., memory element in series with a switch element as described with respect to FIG. 1. FIG. 2 shows a first memory array comprising memory cells 202-1 formed between word lines 204-1 and bits lines 206, and a second memory array comprising memory cells 202-2 formed between word lines 204-2 and bits lines 206. That is, the first memory array formed below bit lines 206 and the second memory array formed above bit lines 206 share common bit lines 206 therebetween.

FIG. 2 is a simplified diagram that does not precisely reflect the three dimensional physical dimensions of the various features illustrated, including the exact proximity of features to one another. FIG. 2 should not be considered as to be representative of the precise topological positioning of the various elements. Rather, FIG. 2 provides an overview of the electrical scheme for a 3D memory array, and the approximate relative arrangement of the various features. Although FIG. 2 shows a 3D array comprising 2 memory arrays, embodiments of the present invention are not so limited, and can include additional memory array(s) arranged into a number of levels.

Figure 3A:
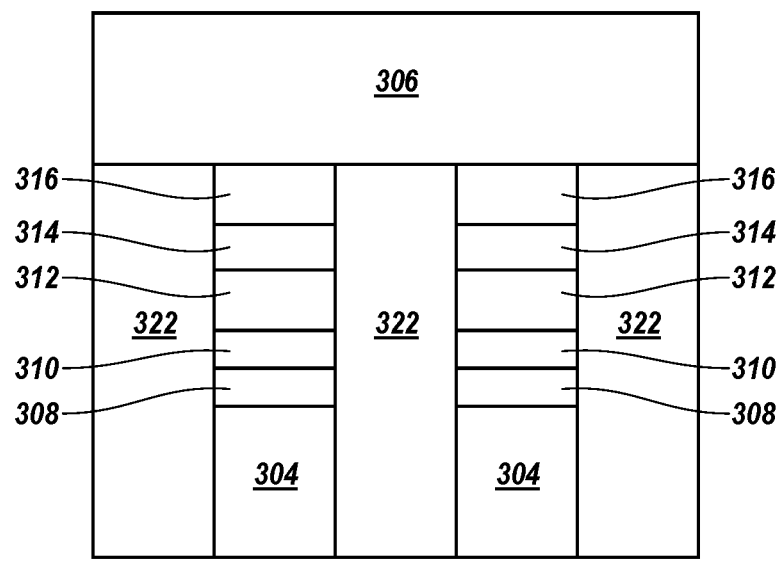
FIGS. 3A and 3B illustrate cross-sectional views of memory cells in accordance with a number of embodiments of the present disclosure.
Figure 3B:
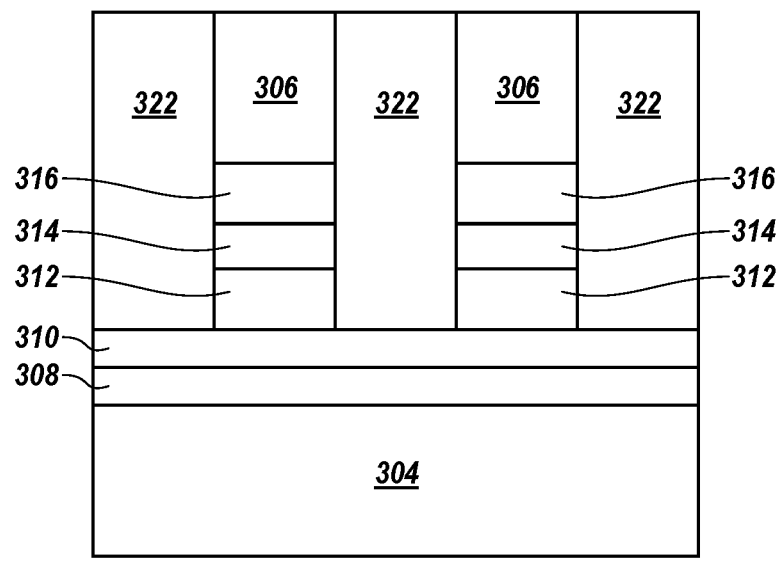

FIGS. 3A and 3B illustrate cross-sectional views of memory cells in accordance with a number of embodiments of the present disclosure. FIG. 3A shows a cross-section in a first dimension, e.g., side view, of a portion of a memory array, such as that shown in FIG. 1. FIG. 3B shows a cross-section in a second dimension, e.g., end view, of a portion of a memory array, such as that shown in FIG. 1. FIGS. 3A and 3B show some additional detail than that shown and described with respect to FIG. 1. The memory cells shown in FIGS. 3A and 3B can be similar to those described with respect to FIGS. 1 and 2.

As shown in FIG. 3A, a stack of materials can be formed over a word line 304. For example, the stack of materials can include a third electrode 308 formed over the word line 304, a switch element 310 formed over the third electrode 308, a second electrode 312 formed over the switch element 310, a memory element 314 formed over the second electrode 312, and a first electrode 316 formed over the memory element 314. A bit line 306 can be formed over the stack extending left-to-right in FIG. 3A and into-and-out-of the paper in FIG. 3B. Word line 304 extends perpendicularly to bit line 306. That is, word line 304 extends into-and-out-of the paper in FIG. 3A and left-to-right in FIG. 3B. Likewise, the third electrode 308 can extend similarly to the word line 304, as shown in FIGS. 3A and 3B.

The cross point memory 100 with memory cells shown in FIGS. 1-3 can be created through dry etch patterning in two perpendicular directions, e.g., corresponding to the direction of the word lines 304 and the bit lines 306. Materials corresponding to respective conductive lines and components of the memory cell can be bulk formed, e.g., deposited, and etched to form the various features. The dry etch patterning in two perpendicular directions forms the various conductive lines and the stacks corresponding to individual memory cells. For example, a first etch can define one dimension of the stack, e.g., a row structure separated by first trenches, self-aligned to the underlying conductive lines, e.g., word lines 304, which in turn can be connected to other circuitry.

Although not shown in FIGS. 3A and 3B, the row structures and trenches can be sealed before being filled with a dielectric material 322, e.g., sealing material. Subsequently, a material comprising the bit lines 306, e.g., conductive material can be formed on top of the row structures, any sealing material(s), and dielectric material 322. A second etch process can be used to form second trenches that define the bit lines 306 in a direction perpendicular to the word lines 304, and again self-aligned to the stacks associated with the memory cells (down to the third electrodes 308). Thereafter, the second trenches and third electrodes 308 can be sealed, and the second trenches filled by dielectric material 322. The result of the above-described sequence is an array of stacks, e.g., active pillars, corresponding to respective memory cells and isolated from one another by dielectric material 322. Word lines 304 below the memory cells connect the stacks in one direction, and bit lines 306 above the memory cells connect the stacks in a perpendicular direction.

Figure 3C:
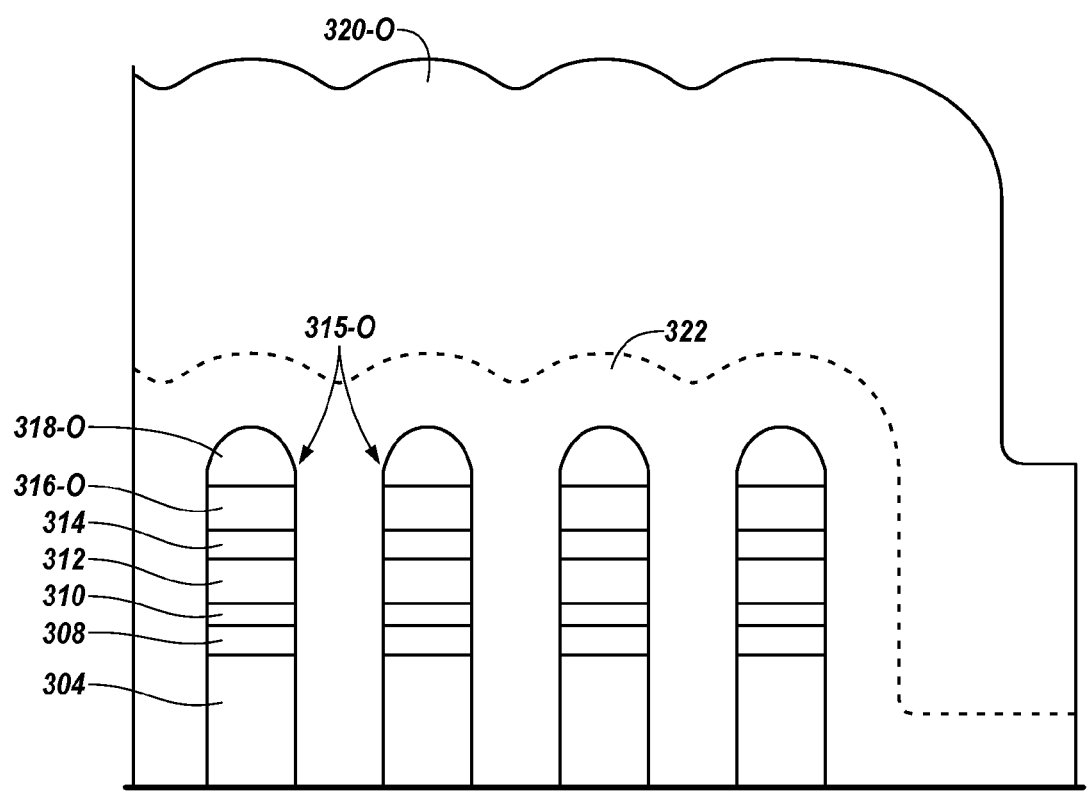
FIG. 3C illustrates a cross-sectional view of prior art process flow showing materials during formation of memory cells before CMP of a filling layer.

FIG. 3C illustrates a cross-sectional view of prior art process flow showing materials during formation of memory cells before CMP of a filling layer. FIG. 3C shows first vertical structures 315-O ("O" designates an old, e.g., previous, configuration), e.g., fin structures, formed from a stack of materials. The first vertical structures include a third electrode 308 formed over the word line 304, a switch element 310 formed over the third electrode 308, a second electrode 312 formed over the switch element 310, a memory element 314 formed over the second electrode 312, a first electrode 316-O formed over the memory element 314, and a hard mask 318-O formed over first electrode 316-O. The hard mask 318-O defines location of the first vertical structures 315-O etched out of stacks of materials blanket formed, e.g., deposited, as shown. The relative thickness of the various materials may not be shown to scale.

After formation of stack materials and hard mask 318, for example by deposition, and etching of the vertical structures 315-O, recesses between the vertical structures 315-O can be sealed by formation of a dielectric material 322, followed by formation of a filling material 320-O over the sealed vertical structures 315-O. The dielectric material 322 and filling material 320-O can be the same materials, or different materials. Although not shown in FIG. 3C, voids in the sealing material 322 can occur between the vertical structures 315-O. Due to the height of the vertical structures 315-O relative to a narrow width between vertical structures 315-O, the top surface of the sealing material 322 can be uneven over area above the vertical structures 315-O, as shown.

Where a uniform thickness of filling material 320-O is formed over the dielectric material 322, the unevenness of the top surface of the dielectric material 322 can be substantially propagated to the top surface of the filling material 320-O such that the top surface of the filling material 320-O is uneven, as shown. The top surface outside the area of the vertical structures 315-O can have areas that are somewhat less uneven, as shown.

Figure 3D:
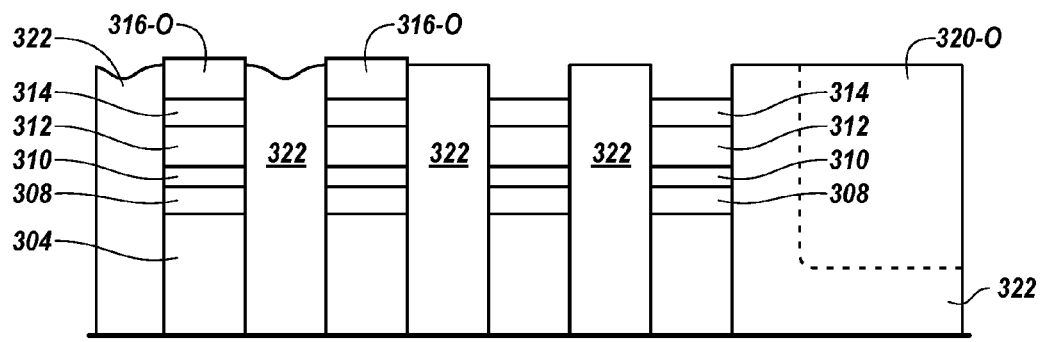
FIG. 3D illustrates a cross-sectional view of prior art process flow showing materials during formation of memory cells after CMP of a filling layer that removes too much material.

FIG. 3D illustrates a cross-sectional view of prior art process flow showing materials during formation of memory cells after CMP of a filling layer that removes too much material. According to a previous process flow, after formation of the sealing material 322 and filling material 320-O, the filling material 320-O can be subjected to a CMP process. An objective of the CMP process can be to remove the filling material 320-O and hard mask 318-O above the vertical structures, with dielectric material 322 and filling material 320-O adjacent and between the vertical structures being planarized to a same height as the vertical structures.

FIG. 3D shows one possible result of that CMP process where too much material can inadvertently be removed, for example, by an aggressive CMP process. FIG. 3D shows various surface defects that can occur from an aggressive CMP process such as depressions in a top surface of dielectric material 322 between the vertical structures, such that the first electrode 316-O, e.g., top electrode, can protrude above the dielectric material 322. FIG. 3D also shows that the CMP can produce "tilted" results when unevenly applied such as more material being removed from one area relative to another area. For example, FIG. 3D shows the CMP having removed the first electrode 316-O from the top of the right two vertical structures (and the first electrode 316-O not removed from the left two vertical structures). Such unintended removal of the first electrode 316-O, or uneven removal of portions of the first electrode 316-O from various vertical structures, can also create unevenness in the top surface due to the recesses left in vertical structures where the first electrode 316-O is unevenly removed by the CMP, as shown.

Figure 3E:
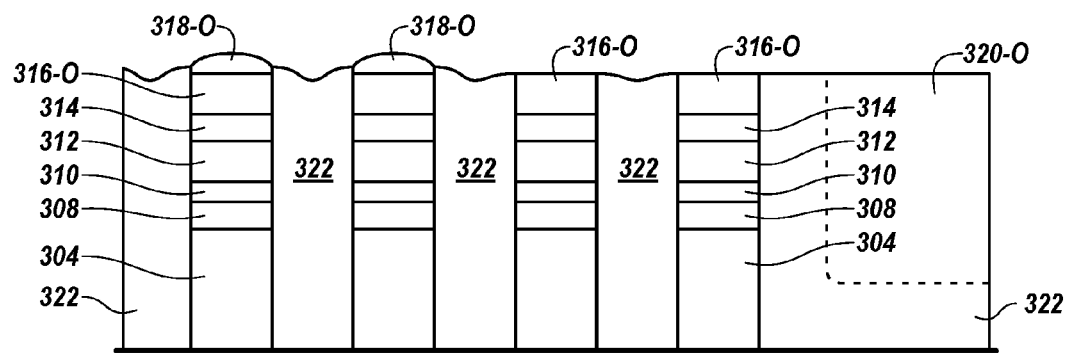
FIG. 3E illustrates a cross-sectional view of prior art process flow showing materials during formation of memory cells after a CMP of a filling layer that does not remove enough material.

FIG. 3E illustrates a cross-sectional view of prior art process flow showing materials during formation of memory cells after a CMP of a filling layer that does not remove enough material. For example, if the CMP is not maintained long enough some hard mask 318-O may remain atop some or all vertical structures. It can be difficult to find a working point with an acceptable process window to ensure absence of hard mask 318-O residues and/or simultaneously prevent undesired removal of vertical structure materials, e.g., first electrode 316-O. That is, without a certain CMP stop reference, CMP control can be challenging.

In particular, FIG. 3E shows some hard mask 318-O remaining on some, e.g., left two, vertical structures and hard mask 318-O not remaining on some other, e.g., right two, vertical structures. Other variations that can result from a CMP that is not aggressive enough are possible such as hard mask 318-O remaining on all vertical structures and/or more hard mask 318-O removed from some vertical structures than other vertical structures, etc. The result is unevenness, e.g., poor planarity, in the top surface after the CMP. Variation in amounts of hard mask 318-O and/or first electrode 316-O removed by a CMP can be attributable to aggressiveness and/or uniformity of application of the CMP across the top surface of the vertical structure and adjacent areas.

Figure 3F:
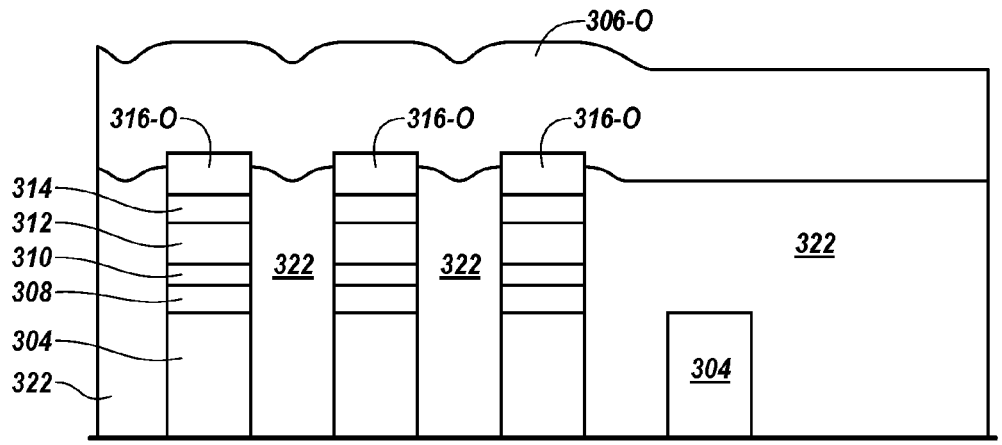
FIG. 3F illustrates a cross-sectional view of prior art process flow showing materials during formation of memory cells after conductive line formation over top surface having poor planarity resulting from CMP.

FIG. 3F illustrates a cross-sectional view of prior art process flow showing materials during formation of memory cells after conductive line material formation, e.g., deposition, over top surface having poor planarity resulting from CMP. After CMP of the filling material 320-O, such as that discussed previously with respect to FIGS. 3D and 3E, an uneven top surface due to various surface defects can result from the CMP. One or more steps may be performed to implement a chop mask, to remove portions of some vertical structures such as the right-most vertical structure shown in FIG. 3F, which is shown being replaced, for example, with additional formed dielectric material 322.

Subsequently to implementation of the chop mask, if any, conductive line 306-O, e.g., bit line material, can be formed, e.g., deposited, over the vertical structures and adjacent areas, as shown in FIG. 3F. Uniform material formation of conductive line 306-O can substantially propagate the top surface irregularities from the vertical structures and interposing dielectric material 322 to the top surface of the conductive line 306-O, as shown in FIG. 3F.

Figure 3G:
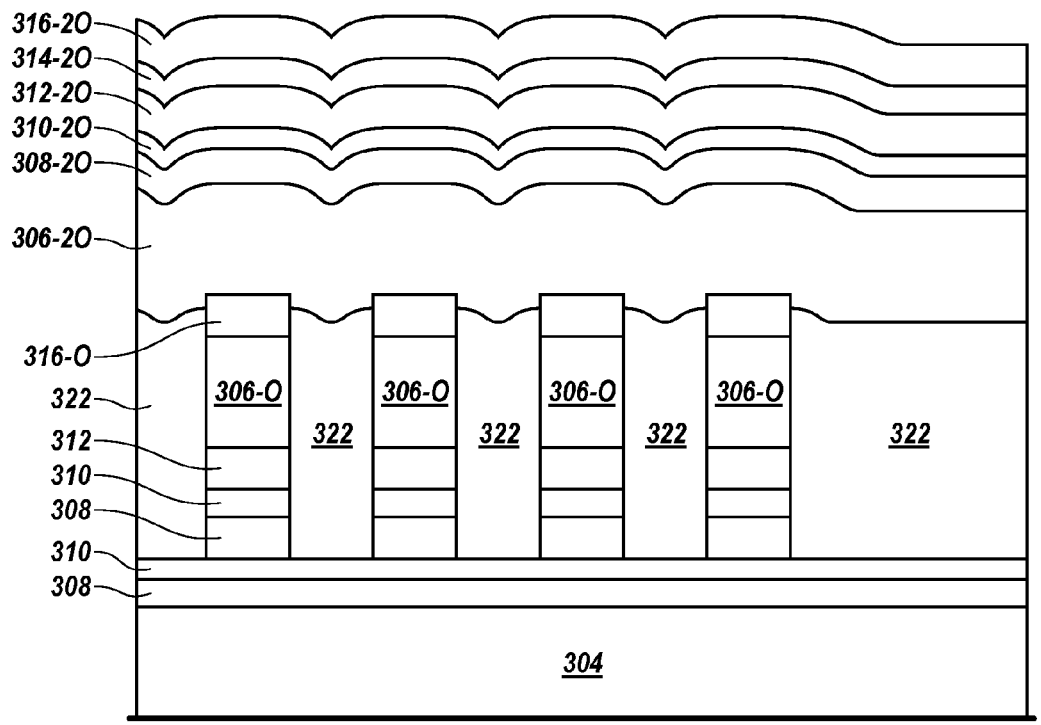
FIG. 3G illustrates a cross-sectional view of prior art process flow showing materials during formation of memory cells after formation of second deck materials over a conductive line having poor top surface planarity.

FIG. 3G illustrates a cross-sectional view of prior art process flow showing materials during formation of memory cells after formation of second deck materials over a conductive line having poor top surface planarity. Whereas FIG. 3F shows a view direction that is parallel to word line 304 orientation, FIG. 3G shows a view perpendicular to that shown in FIG. 3F, e.g., perpendicular to word line 304 orientation.

FIG. 3G shows that irregularities resulting from poor CMP of the vertical structures of a first deck of memory cells can propagate throughout the materials formed for fabrication of a second deck of memory cells above the first deck of memory cells. FIG. 3G shows materials formed over the conductive line 306-O including a second deck third electrode 308-2O formed over conductive line 306-O, a second deck switch element 310-2O formed over the second deck third electrode 308-2O, a second deck second electrode 312-2O formed over the second deck switch element 310-2O, a second deck memory element 314-2O formed over the second deck second electrode 312-2O, and a second deck first electrode 316-2O formed over the second deck memory element 314-2O.

As is shown in FIG. 3G, uniform formations of materials corresponding to the second deck of memory cells formed over the first deck of memory cells can cause propagation of the top surface irregularities to each of the various second deck materials. Such irregularities in material formation can degrade the quality of structures, and thus memory cells, formed from the second deck materials. As such, it can be advantageous to improve planarity resulting from CMP of the vertical structures and interposing adjacent dielectric materials, e.g., sealing material 322 and filling material 320.

According to embodiments of the present disclosure, a more robust solution to the above-described formation issues, including improved planarity over previous approaches is described below. The disclosed process flow includes formation of stack materials including reduced hard mask thickness and increased first electrode, e.g., top electrode, thickness with respect to previous approaches. Dry etching to define vertical structures corresponding to lower conductive lines, e.g., word lines, can be controlled to intentionally consume the entire hard mask materials above the vertical structures, and optionally, some portion of the first electrode, e.g., top electrode.

In contrast to formation of the vertical structures of the previous approach shown in FIG. 3C, vertical structures are etched so as to be devoid of any hard mask remaining above the first electrode, e.g., top electrode. Some of the first electrode, e.g., top electrode, may also be consumed during the etch forming the vertical structures to ensure no hard mask residues remains thereabove.

Furthermore, after sealing the vertical structures with dielectric materials, the sealed vertical structures are not filled with filling materials. Rather, the dielectric materials by which the vertical structures are sealed are etched back exposing the top of the vertical structures, including at least a portion of the first electrode, e.g., top electrode. Thereafter, an interconnecting first electrode, e.g., top electrode, material can be formed over the vertical structures, the etched-back dielectric material, e.g., sealing material, formed between the vertical structures, and a reference level in the vicinity of the vertical structures. According to various embodiments, the first electrodes, e.g., top electrodes, of vertical structures are electrically coupled by the interconnecting first electrode material. Thereafter, the interconnecting first electrode material can be CMP'd. The CMP of the interconnecting first electrode material can be controlled, at least in part, with respect to detection of the reference level. In this manner, the interconnected vertical structures can have an improved planarity resulting from the CMP with respect to previous approaches. Further processing to complete formation of a first deck of memory cells, and optionally additional deck(s) of memory cells, can be completed over the CMP'd top surface of the interconnecting first electrode material.

Figure 3H:
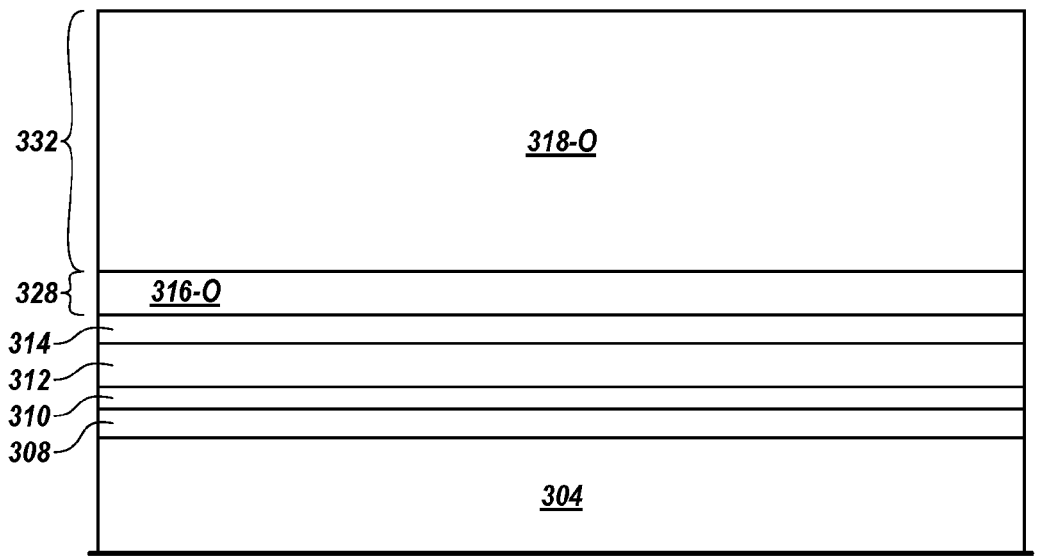
FIG. 3H illustrates a cross-sectional view of prior art process flow showing initial formation of materials during formation of memory cells.

FIG. 3H illustrates a cross-sectional view of prior art process flow showing initial formation of materials during formation of memory cells. FIG. 3H shows blanket formation of materials such as those from which the vertical structures shown in FIG. 3C are formed. In particular, first electrode 316-O is formed to a first thickness 328 and hard mask 318-O is formed to a second thickness 332. The discussion below with respect to FIGS. 3I-3W provides additional details of formation of memory cells by the improved CMP process of the present disclosure.

Figure 3I:
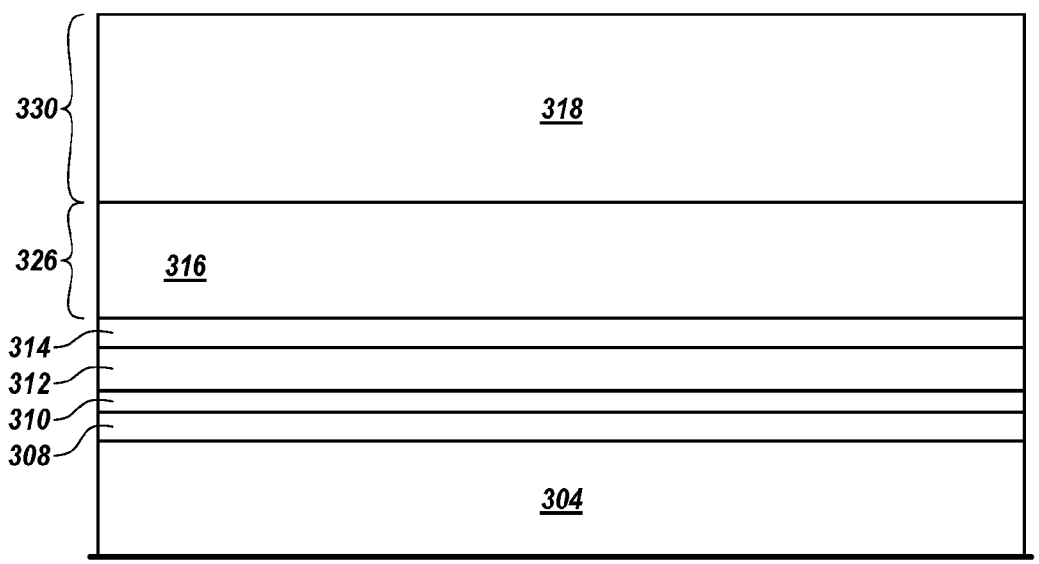
FIG. 3I illustrates cross-sectional view of intermediate process flow for forming memory cells showing initial formation of materials in accordance with a number of embodiments of the present disclosure.

FIG. 3I illustrates cross-sectional view of intermediate process flow forming for memory cells showing initial formation of materials in accordance with a number of embodiments of the present disclosure. The stack of materials shown in FIG. 3I can include material corresponding to a third electrode 308 formed over material corresponding to a word line 304, material corresponding to a switch element 310 formed over the material corresponding to the third electrode 308, material corresponding to a second electrode 312 formed over the material corresponding to the switch element 310, and material corresponding to a memory element 314 formed over the material corresponding to the second electrode 312. The above-mentioned materials can be formed in a manner similar to that shown in FIG. 3H for a previous approach.

According to various embodiments of the present disclosure however, material corresponding to a first electrode 316, e.g., top electrode, can be formed over the material corresponding to the memory element 314 to a third thickness 326, and material corresponding to a hard mask 318 can be formed over the material corresponding to a first electrode 316 to a fourth thickness 330. According to various embodiments, the material corresponding to a first electrode 316, e.g., top electrode, can be formed to a thickness greater than that formed according to previous approaches. That is, the third thickness 330 can be greater than the first thickness 328. Fourth thickness 330 can be smaller than second thickness 332. According to other embodiments, the fourth thickness 330 can be smaller than the second thickness 332 by a same amount that the third thickness 330 is greater than the first thickness 328, e.g., keeping the total thicknesses of the third and fourth thicknesses approximately the same as the total thicknesses of the first and second thicknesses.

More particularly, material corresponding to a first electrode 316, e.g., top electrode, can be formed to a third thickness 326 that at least includes a first sacrificial portion that is removed following, or during, removal of overlying hard mask 318. The first sacrificial portion can be in addition to at least some base portion that remains after removal of the first sacrificial portion, the based portion corresponding to first electrode 316, e.g., top electrode, shown, for example, in FIG. 3J.

Figure 3J:
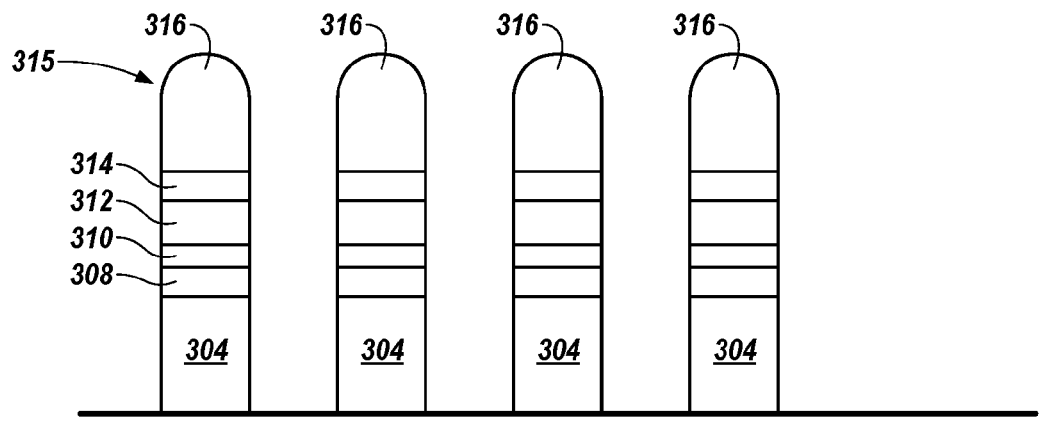
FIG. 3J illustrates cross-sectional view of intermediate process flow for forming memory cells showing formation of first vertical structures in accordance with a number of embodiments of the present disclosure.

FIG. 3J illustrates cross-sectional view of intermediate process flow for forming memory cells showing formation of first vertical structures 315 in accordance with a number of embodiments of the present disclosure. The vertical structures 315 shown in FIG. 3J are different than the vertical structures 315-O fabricated according to a previous approach shown in FIG. 3C in the same manner in which the configuration of the stack of materials shown in FIG. 3I is different than the configuration of the stack of materials shown in FIG. 3H. That is, the vertical structures 315 shown in FIG. 3J include a thicker first electrode 316, e.g., top electrode, than that provided in the vertical structures 315-O shown in FIG. 3C. In addition, the vertical structures 315 shown in FIG. 3J do not include hard mask material as part of the vertical structures 315, e.g., over the first electrode 316 as is shown by hard mask 318-O for vertical structures 315-O in FIG. 3C.

According to various embodiments of the present disclosure, a dry etch can be performed to form vertical structures 315, where the vertical structures 315 are self-aligned with word lines 304. The dry etch forming the vertical structures 315 is controlled, e.g., properly calibrated, to at least intentionally consume all material corresponding to the hard mask 318 patterning the vertical structures 315. The dry etch forming the vertical structures 315 can optionally be controlled to also consume a portion of the first electrode 316, e.g., the first sacrificial portion.

Figure 3K:
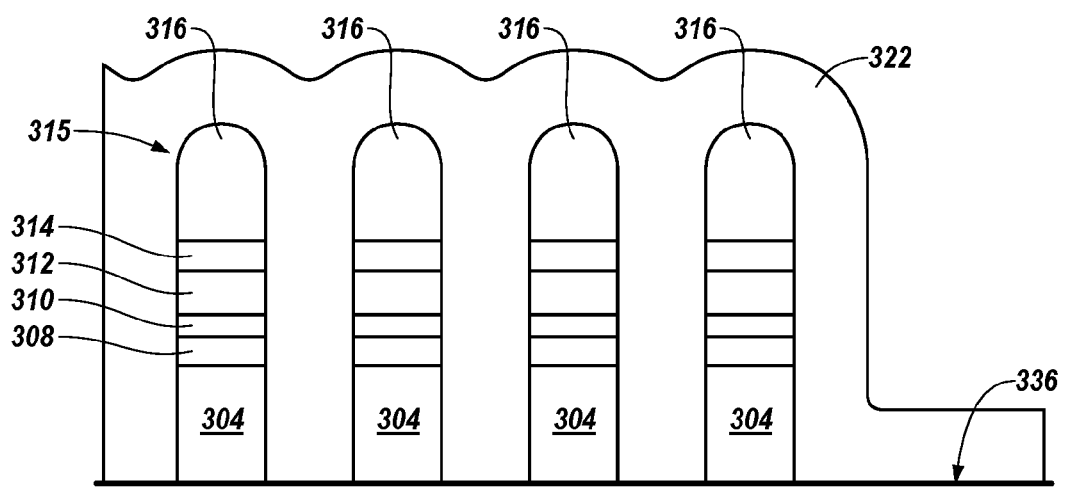
FIG. 3K illustrates cross-sectional view of intermediate process flow for forming memory cells showing formation of dielectric material over the vertical structures in accordance with a number of embodiments of the present disclosure.

FIG. 3K illustrates cross-sectional view of intermediate process flow for forming memory cells showing formation of dielectric material 322 over the vertical structures 315 in accordance with a number of embodiments of the present disclosure. FIG. 3K shows the first vertical structures 315 being sealed by the dielectric material 322, e.g., sealing material, similar to that shown in FIG. 3C with respect to vertical structures 315-O according to a previous approach. Dielectric material 322 can be formed over, and around, vertical structures 315, including over a reference level 336, e.g., substrate, in an area in the vicinity of, e.g., adjacent, the vertical structures. As used herein, "substrate" is not limited to a wafer, e.g., silicon wafer, substrate, and can include a structured substrate, e.g., a wafer with circuits and/or devices formed therein. According to one or more embodiments of the present disclosure, the thickness of dielectric material 322 formed over the vertical structures 315 and the reference level 336 can be uniform and be substantially a same depth.

Figure 3L:
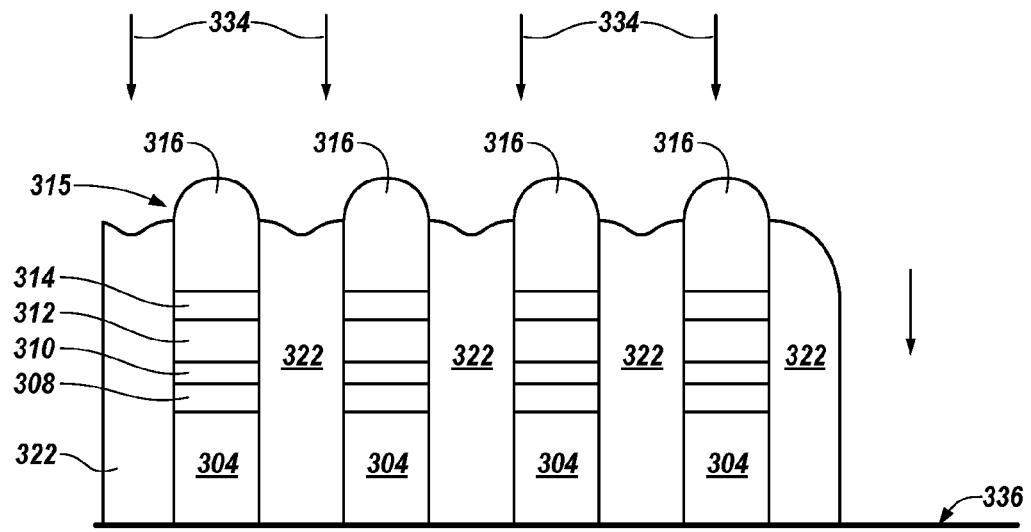
FIG. 3L illustrates cross-sectional view of intermediate process flow for forming memory cells showing sealing etch back of dielectric material sealing vertical structures in accordance with a number of embodiments of the present disclosure.

FIG. 3L illustrates cross-sectional view of intermediate process flow for forming memory cells showing sealing etch back of dielectric material sealing vertical structures 315 in accordance with a number of embodiments of the present disclosure. In contrast to the configuration shown in FIG. 3C having a filling material 320-O formed over the dielectric material 322, e.g., sealing material, followed by CMPing of both dielectric material and filling material 320-O according to a previous approach, FIG. 3L shows dielectric material 322 subjected to an etch 334. That is, no deposit is made of filling material over the dielectric material 322, e.g., sealing material.

According to various embodiments of the present disclosure, dielectric material 322 can be partially etched back, for example, to at least expose a portion, e.g., the top, of the vertical structures 315. That is, dielectric material 322 can be etched back to expose the first electrode 316 portion of vertical structures 315. For example, up to one half of first electrode 316 can be exposed by etch 334. As the formation of dielectric material 322 is made to a substantially uniform thickness over the vertical structures and reference level 336, e.g., substrate, detection of the reference level 336 can be used to control the etch back as providing an indication corresponding to exposure of the vertical structures. Note, for example, in FIG. 3D showing a previous approach where CMPing occurs after formation of filling material 320-O over the dielectric material 322 sealing the vertical structures. CMPing the dielectric material 322 and filling material 320-O according to the previous approach illustrated in FIG. 3D does not expose the substrate due to depth of materials formed thereover. As such, according to the previous approach, the substrate is not useful as a reference level by which to control the etch-back, e.g., as a gauge of vertical structure exposure.

Figure 3M:
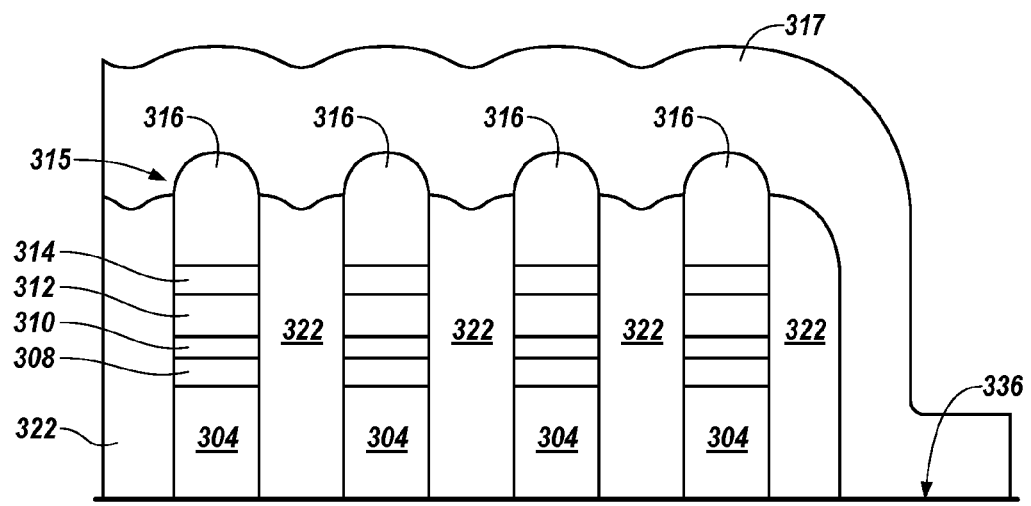
FIG. 3M illustrates cross-sectional view of intermediate process flow for forming memory cells showing formation of interconnecting first electrode material over the exposed vertical structures in accordance with a number of embodiments of the present disclosure.

FIG. 3M illustrates cross-sectional view of intermediate process flow for forming memory cells showing formation of interconnecting first electrode material over the exposed vertical structures 315 in accordance with a number of embodiments of the present disclosure. After etch-back of dielectric material 322 to expose first electrode 316 of vertical structures, interconnection conductive material 317 can be formed over exposed vertical structures 315 and etched-back dielectric material 322, as shown in FIG. 3M. According to some embodiments, the interconnection conductive material 317 can be the same material that comprises first electrode 316. According to other embodiments, interconnection conductive material 317 can be a different conductive material than that which comprises first electrode 316. Interconnection conductive material 317 can electrically couple the first electrodes 316 of a plurality of vertical structures. According to one or more embodiments of the present disclosure, the thickness of interconnection conductive material 317 formed over the vertical structures 315, etched-back dielectric materials 322, and the reference level 336 can be uniform and be substantially a same depth, as shown.

Figure 3N:
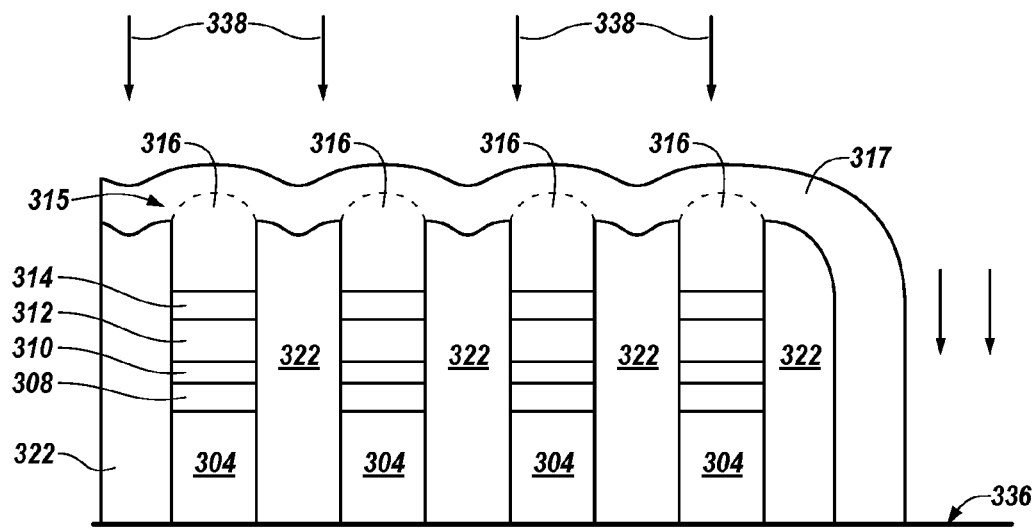
FIG. 3N illustrates cross-sectional view of intermediate process flow for forming memory cells showing etch-back of interconnection conductive material in accordance with a number of embodiments of the present disclosure.

FIG. 3N illustrates cross-sectional view of intermediate process flow for forming memory cells showing etch back of interconnection conductive material 317 in accordance with a number of embodiments of the present disclosure. According to various embodiments of the present disclosure, interconnection conductive material 317 can be exposed to an etch 338, for example, to remove some but not all interconnection conductive material 317 electrically coupling the first electrode 316 of a plurality of vertical structures. The interconnection conductive material 317 can provide some structural integrity and stability to the vertical structures.

As the formation of the interconnection conductive material 317 is made to a substantially uniform thickness over the vertical structures and reference level 336, e.g., substrate, detection of the reference level 336 can be used to control, e.g., properly calibrate, the partial etch of the interconnection conductive material 317, thereby providing an indication corresponding to location of the top surface of the interconnection conductive material 317 with respect to the location of the vertical structures, similar to the etch process described previously with respect to the sealing etch back of dielectric materials 322. According to various embodiments of the present disclosure, interconnection conductive material 317 is etched-back so as to leave some thickness thereof over vertical structures 315 and/or remove interconnection conductive material 317 completely from the reference level 336, e.g., in an open area in the vicinity adjacent the vertical structures 315.

Figure 3O:
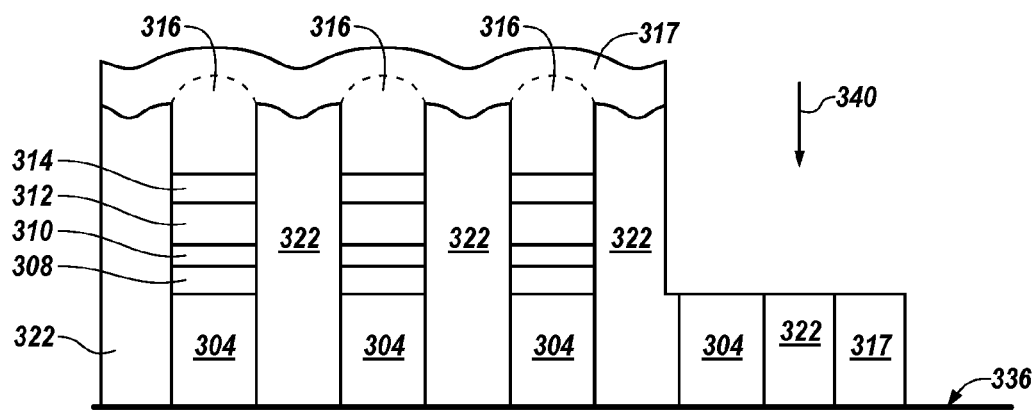
FIG. 3O illustrates cross-sectional view of intermediate process flow for forming memory cells showing chop etch of some vertical structures and/or interconnection conductive material in accordance with a number of embodiments of the present disclosure.

FIG. 3O illustrates cross-sectional view of intermediate process flow for forming memory cells showing chop etch of some vertical structures and/or interconnection conductive material 317 in accordance with a number of embodiments of the present disclosure. After etch-back of interconnection conductive material 317 (described above) a chop mask (not shown) can be applied, e.g., to preserve some vertical structures and expose other vertical structures, and a chop etch 340 can be used to remove portions of vertical structure(s) and interconnection conductive material 317. For example, the chop etch can be used to open conductive line interconnections, e.g., word line loops outside memory cell portions of an array.

Figure 3P:
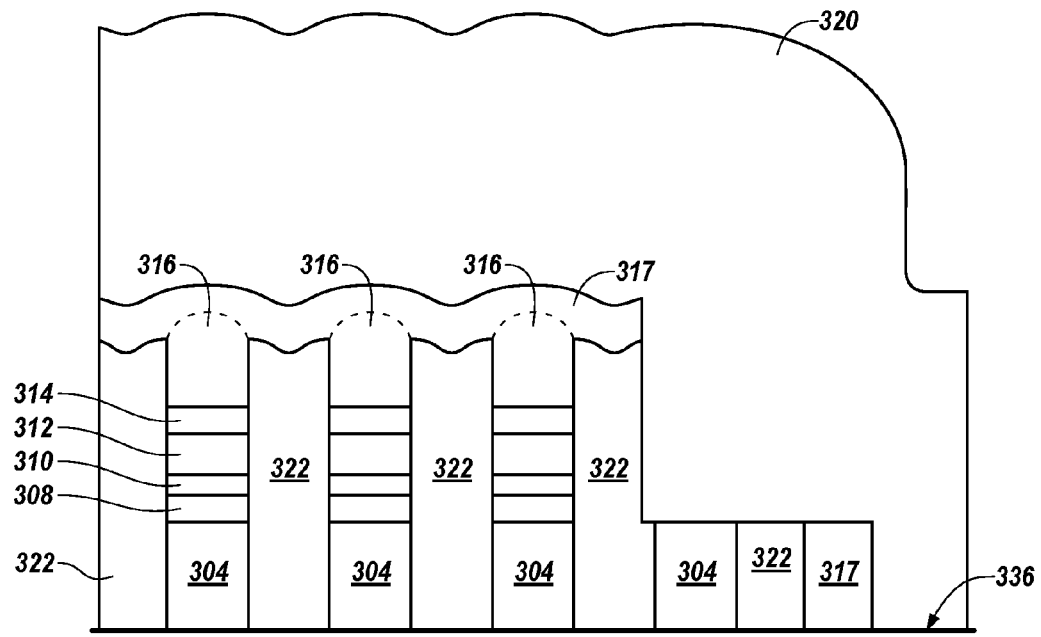
FIG. 3P illustrates cross-sectional view of intermediate process flow for forming memory cells showing formation of filling material over interconnection conductive material in accordance with a number of embodiments of the present disclosure.

FIG. 3P illustrates cross-sectional view of intermediate process flow for forming memory cells showing formation of filling material over interconnection conductive material in accordance with a number of embodiments of the present disclosure. FIG. 3P shows a second dielectric material, e.g., filling material 320, over interconnection conductive material 317, materials exposed by the chop etch, and the open area adjacent the vertical structures over the reference level 336, e.g., substrate. The filling material 320 can be an insulating material, and can be the same or different material as the dielectric material 322.

Figure 3Q:
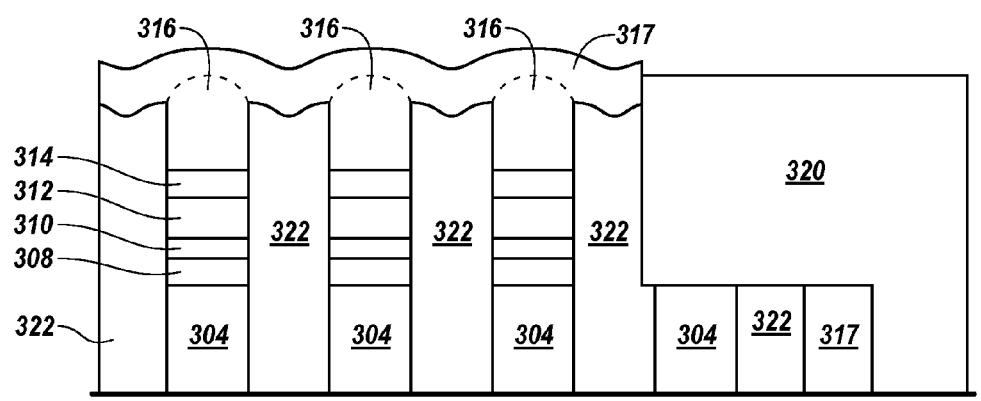
FIG. 3Q illustrates cross-sectional view of intermediate process flow for forming memory cells after filling material CMP in accordance with a number of embodiments of the present disclosure.

FIG. 3Q illustrates cross-sectional view of intermediate process flow for forming memory cells after filling material CMP in accordance with a number of embodiments of the present disclosure. After deposit of filling material 320 as discussed above with respect to FIG. 3P, the filling material 320 can be subjected to a CMP, which can produce the results shown in FIG. 3Q. According to various embodiments, the CMP can proceed to CMP a top surface of interconnection conductive material 317, e.g., remove all filling material 320 over the interconnection conductive material 317 so as to expose the top surface thereof.

Figure 3R:
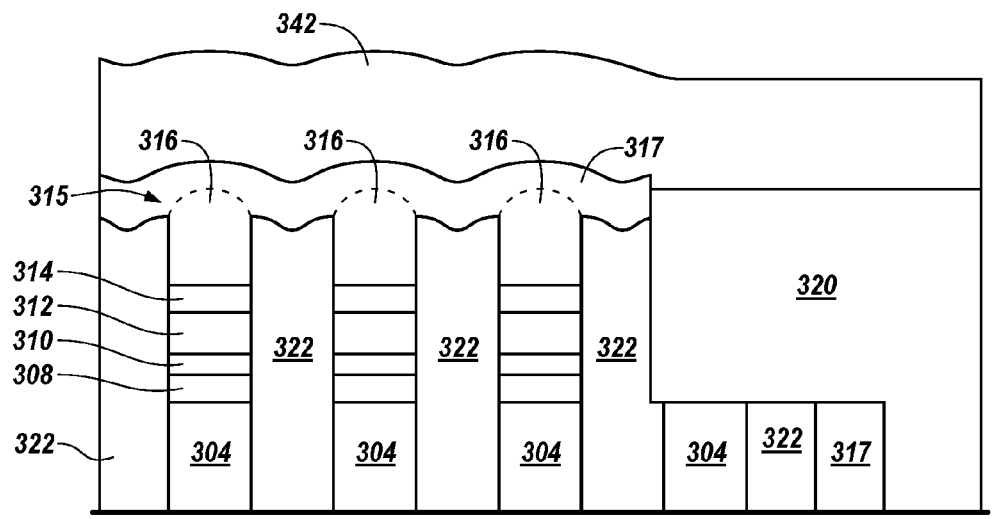
FIG. 3R illustrates cross-sectional view of intermediate process flow for forming memory cells showing formation of conductive material after filling CMP in accordance with a number of embodiments of the present disclosure.

FIG. 3R illustrates cross-sectional view of intermediate process flow for forming memory cells showing formation of conductive material 342 after filling CMP in accordance with a number of embodiments of the present disclosure. After CMP of the filling material discussed above with respect to FIG. 3Q, a conductive material 342, e.g., metal, can be formed, e.g., by physical vapor formation, over the interconnection conductive material 317, e.g., exposed top surface thereof, and the filling material 320 remaining after CMP, e.g., over the materials exposed by the chop etch and the adjacent open area over the reference level.

Figure 3S:
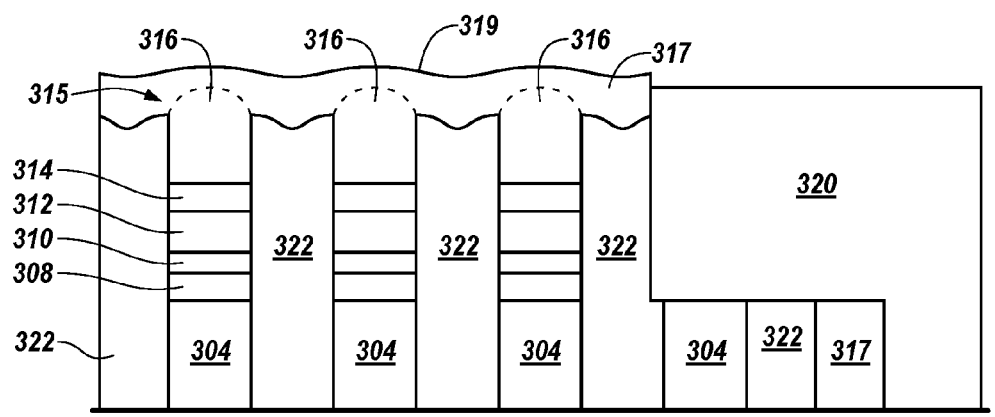
FIG. 3S illustrates cross-sectional view of intermediate process flow for forming memory cells after metal CMP in accordance with a number of embodiments of the present disclosure.

FIG. 3S illustrates cross-sectional view of intermediate process flow for forming memory cells after metal CMP in accordance with a number of embodiments of the present disclosure. After deposit of conductive material 342 as discussed above with respect to FIG. 3R, the conductive material 342 can be subjected to a CMP, which can produce the results shown in FIG. 3S. According to various embodiments, the metal CMP can proceed to remove all conductive material 342. According to various embodiments, the metal CMP can proceed to remove portions of the interconnection conductive material 317.

By removing all of the conductive material 342 and portions of the interconnection conductive material 317, e.g., shaving the peaks off the top surface of the interconnection conductive material 317, the result is better planarity of the top surface 319 over the vertical structures 315 with respect to the top surface of the interconnection conductive material 317 prior to formation of the conductive material 342 and/or a top surface over vertical structures in previous approaches. This better planarity is shown in FIG. 3S by the top surface 319 over the vertical structures 315 being smoother than the top surface of the interconnection conductive material 317 prior to formation of the conductive material 342 shown in FIG. 3Q.

One advantage of the process of the present disclosure is that the CMP of conductive material 342 and portions of the interconnection conductive material 317 can be stopped on a continuous surface, e.g., at top surface 319 of the portion of interconnection conductive material 317 formed over the vertical structures 315. Contrast with FIGS. 3C and 3D showing a previous approach where the vertical structures self-aligned with the word lines 304, having dielectric material 322 that is being CMPed located between the vertical structures, do not constitute a continuous surface. As such, the configuration of the previous approach shown in FIG. 3D is much more prone to create defects, such as residuals and/or undesired first electrode 316-O, e.g., top electrode, removal. The benefit of having a continuous surface on which to end a CMP process step exists also with respect to CMPing applied to the configuration shown in FIG. 3P to arrive at the configuration shown in FIG. 3Q, which are discussed further below.

Figure 3T:
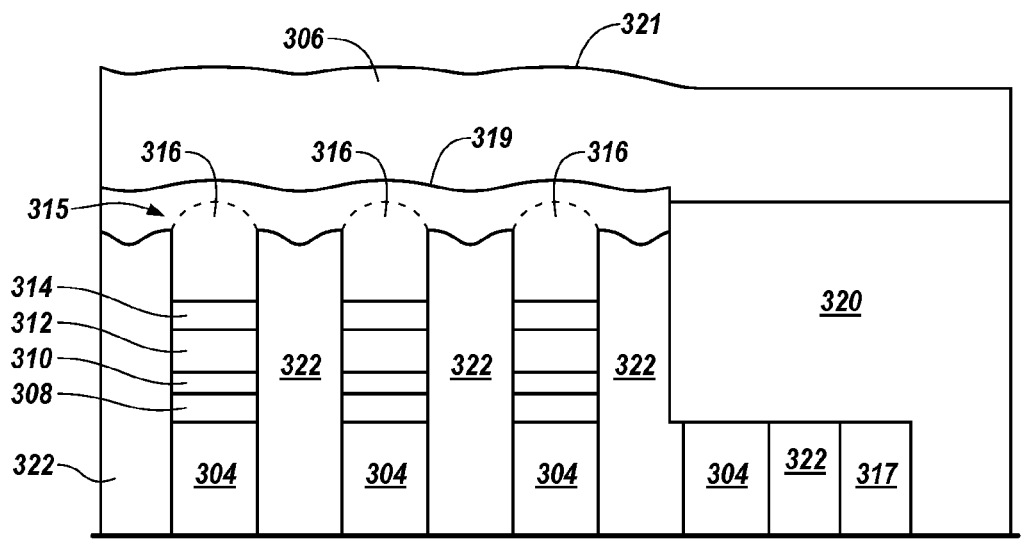
FIG. 3T illustrates cross-sectional view of intermediate process flow for forming memory cells showing formation of conductive material after metal CMP in accordance with a number of embodiments of the present disclosure.

FIG. 3T illustrates cross-sectional view of intermediate process flow for forming memory cells showing formation of conductive material 306 after metal CMP in accordance with a number of embodiments of the present disclosure. After CMP of the conductive material 342 (and optionally the interconnection conductive material 317) and optionally filling material 320 to result in the configuration shown in FIG. 3S, a conductive material 306, e.g., metal, can be formed over the CMPed top surface 319 and filling material 320. The conductive material 306 can be material from which bit lines will be subsequently defined. The planarity of a top surface 321 of conductive material 306 resulting from the presently-disclosed methods as shown in FIG. 3T can be compared to planarity of a top surface of conductive line 306-O, e.g., bit line material, shown in FIG. 3F resulting from a previous approach.

Figure 3U:
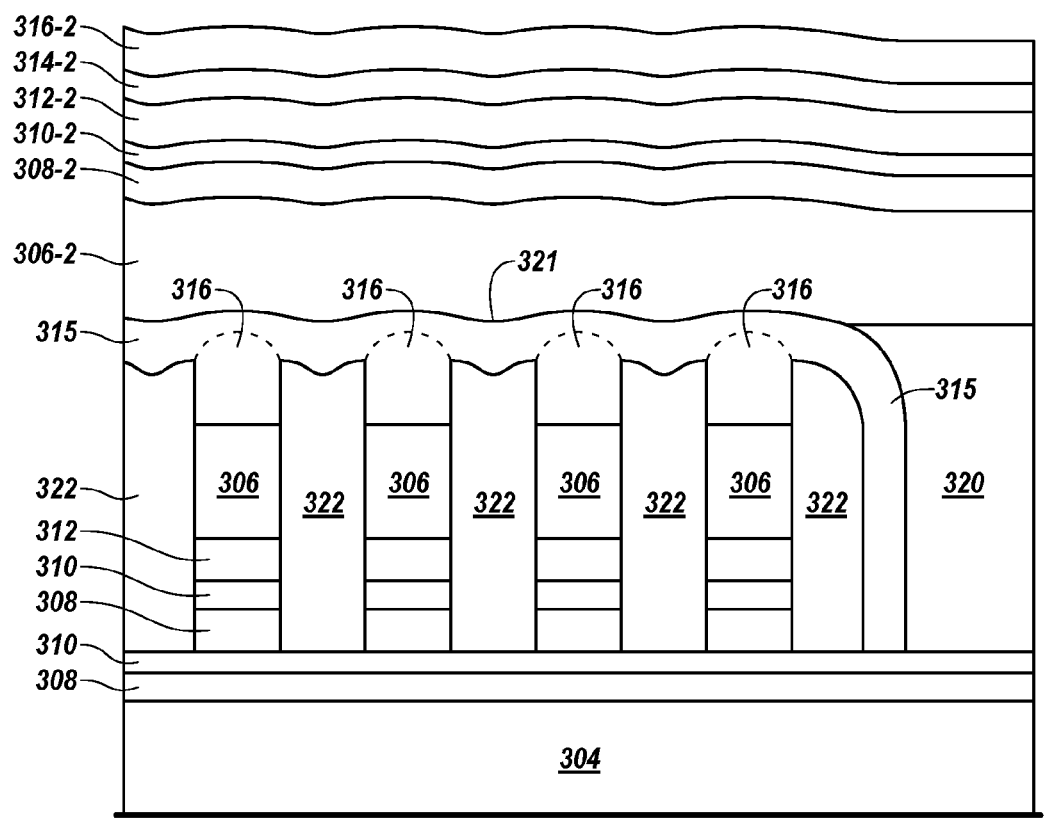
FIG. 3U illustrates cross-sectional view of intermediate process flow for forming memory cells showing formation of additional materials over first deck bit line material in accordance with a number of embodiments of the present disclosure.

FIG. 3U illustrates cross-sectional view of intermediate process flow for forming memory cells showing formation of additional materials over first deck bit line material in accordance with a number of embodiments of the present disclosure. FIG. 3U shows a cross-sectional view that is oriented perpendicular to the cross-sectional view shown in FIG. 3T. Because of the better planarity achieved by formation and CMPing of the interconnection conductive material 317 and/or conductive material 342, the underlying top surface 319 over which the conductive material 306 is smoother, which is propagated to the top surface 321 of the conductive material 306 by uniform formation thereof. This improved top surface 321 provides a smoother base over which additional materials can be formed, e.g., for formation of subsequent deck(s) of memory cells thereover.

The stack of materials shown in FIG. 3U formed over conductive material 306 can include materials for forming a second deck of memory cells. The second deck stack of materials can include material corresponding to a second deck third electrode 308-2 formed over conductive material 306, e.g., material corresponding to bit line(s), material corresponding to a second deck switch element 310-2 formed over the material corresponding to the second deck third electrode 308-2, material corresponding to a second deck second electrode 312-2 formed over the material corresponding to the second deck switch element 310-2, material corresponding to a second deck memory element 314-2 formed over the material corresponding to the second deck second electrode 312-2, and material corresponding to a second deck first electrode 316-2 formed over the material corresponding to the second deck memory element 314-2. The improved planarity of conductive material 306 resulting by the methods described in the present disclosure are illustrated as propagating through to each of the materials forming the second deck memory cells.

According to various embodiments of the present disclosure, conductive material 306-2, e.g., material corresponding to bit line(s), forms a conductive line common to, e.g., electrically connected to, memory cells of the first deck and/or the second deck. That is, one bit line is functional to control memory cells arranged in a plurality of decks, e.g., two decks. Although FIG. 3U shows conductive material 306-2 as a homogeneous material, conductive material 306 may be comprised of a plurality of conductive materials, which can be coupled to one another, such as by, contact of adjacent materials or by other connections. Also, although the various materials formed above conductive material 306-2 are in a same order bottom-to-top as the materials used to form the memory cells below conductive material 306-2, embodiments of the present disclosure are not so limited and the various materials formed above conductive material 306-2 can be formed in an arrangement that is a mirror image of the materials used to form the memory cells below conductive material 306-2, e.g., bottom-to-top: 316-2, 314-2, 312-2, 310-2, and 308-2. Also, memory element and switch element locations can be swapped in one or both decks in some embodiments.

Figure 3V:
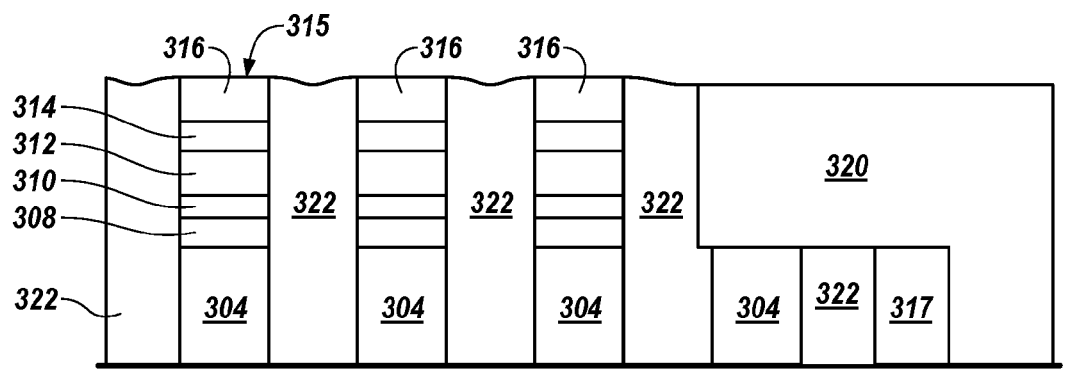
FIG. 3V illustrates cross-sectional view of intermediate process flow for forming memory cells after alternative metal etch back in accordance with a number of embodiments of the present disclosure.
Figure 3W:
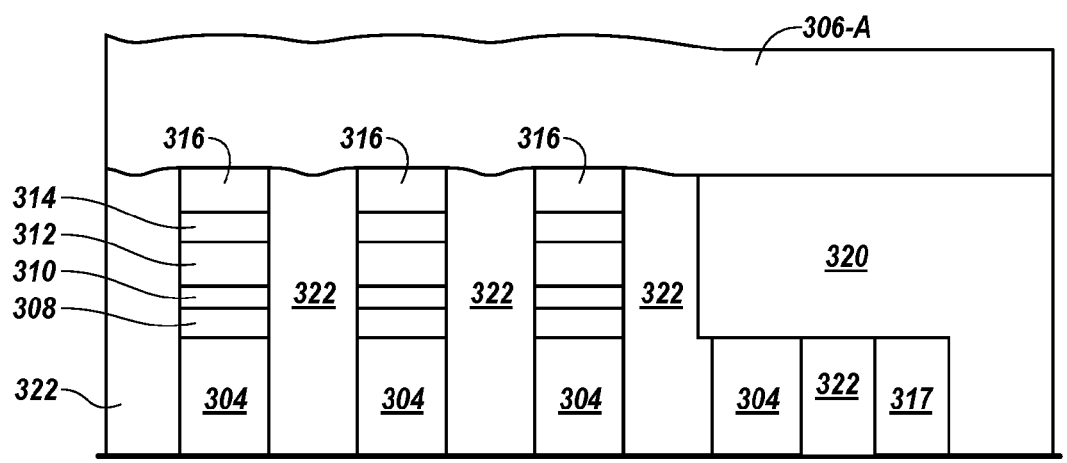
FIG. 3W illustrates cross-sectional view of intermediate process flow for forming memory cells showing formation of conductive material after alternative metal etch back in accordance with a number of embodiments of the present disclosure.

FIG. 3V illustrates cross-sectional view of intermediate process flow for forming memory cells after alternative metal etch back in accordance with a number of embodiments of the present disclosure. The discussion above with respect to FIG. 3S involved a metal CMP of conductive material 342 that substantially left intact interconnection conductive material 317. According to various alternative embodiments of the present disclosure, an alternative metal etch back that is, for example, longer duration or more aggressive chemistry, etc., can be implemented to remove all of conductive material 342, all of interconnection conductive material 317, and optionally some portion of first electrode 316, e.g., top electrode, of the vertical structures 315. For example, the alternative metal etch back, such as etch 338, e.g., dry etch back, described with respect to FIG. 3N (changing the configuration from that shown in FIG. 3M) can have a longer duration so as to result in the configuration shown in FIG. 3V.

According to other various alternative embodiments of the present disclosure, the conductive material 342 is not formed over the interconnection conductive material 317 (as shown in FIG. 3R), and an alternative metal etch back can be implemented to remove all of interconnection conductive material 317, and optionally some portion of first electrode 316, e.g., top electrode, of the vertical structures 315. The resulting configuration, with first, e.g., top, electrode 316, dielectric materials 322, and filling material 320 etched back to substantially similar elevations, for each of the above-mentioned alternative metal etch backs is shown in FIG. 3V, which can provide more top surface planarity than previous approaches (compare to FIG. 3D and/or 3E).

FIG. 3W illustrates cross-sectional view of intermediate process flow for forming memory cells showing formation of conductive material 306 after alternative metal etch back in accordance with a number of embodiments of the present disclosure. After the alternative metal etch back of the interconnection conductive material 317 (and optionally conductive material 342 if formed) as described above with respect to FIG. 3V, a conductive material 306-A, e.g., metal, can be formed over the resulting top surface after the alternative metal etch back comprising first electrode 316, dielectric material 322, and filling material 320. According to some embodiments, the alternative metal etch back can persist so as to etch dielectric materials 322 to be lower in elevation than the top of the vertical structures, e.g., top surface of the first, electrode 316, e.g., top electrode.

The conductive material 306-A can be the same as material for conductive material 306 previously described, e.g., material from which bit lines will be subsequently defined. The planarity of a top surface of conductive material 306-A resulting from the presently-disclosed alternative metal etch back methods described with respect to FIG. 3V can be improved compared to planarity of a top surface of conductive line 306-O, e.g., bit line material, shown in FIG. 3F resulting from a previous approach. Benefits resulting from the presently-disclosed alternative metal etch back method described with respect to FIG. 3V can be that conductive material 306-A formed with less thickness than in previous approaches.

The intermediate process flow for forming memory cells shown in FIG. 3W is at a stage similar to that shown in FIG. 3T. As such, the process flow for forming memory cells can continue as discussed above with respect to FIG. 3U over the top surface of conductive material 306-A.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for forming an array of memory cells, comprising:
    forming a plurality of vertical structures each having a switch element in series with a memory element in series with a top electrode;
    forming an interconnection conductive material between the respective top electrodes of the plurality of vertical structures;
    etching-back the interconnection conductive material;
    forming a dielectric material over the interconnection conductive material after etching-back and over a reference level adjacent the plurality of vertical structures;
    chemical mechanical polishing (CMPing) the dielectric material to remove a first portion of the dielectric material from over the interconnection conductive material while keeping a second portion of the dielectric material over the reference level; and
    forming a conductive line over the interconnection conductive material after etching-back the interconnection conductive material.

2. The method of claim 1, wherein forming the interconnection conductive material includes forming the interconnection conductive material from a same material as the respective top electrodes of the plurality of vertical structures.

3. The method of claim 1, further comprising:
forming the interconnection conductive material includes forming the interconnection conductive material over the respective top electrodes of the plurality of vertical structures; and
wherein etching back the interconnection conductive material includes removing portions of the interconnection conductive material without exposing the respective top electrodes of the plurality of vertical structures.

4. The method of claim 1, further comprising forming a conductive material over the interconnection conductive material,
wherein etching-back the interconnection conductive material includes etching-back the conductive material formed over the interconnection conductive material.

5. The method of claim 4, wherein etching-back the interconnection conductive material includes removing the conductive material to reach portions of the interconnection conductive material.

6. The method of claim 5, wherein etching-back the conductive material includes removing all of the conductive material over the interconnection conductive material.

7. The method of claim 5, wherein etching-back the conductive material includes:
removing conductive material over first portions of the interconnection conductive material; and
not removing conductive material over second portions of the interconnection conductive material.

8. The method of claim 1, further comprising:
sealing the vertical structures with a dielectric material formed between and over the plurality of vertical structures; and
etching the dielectric material to expose the respective top electrodes of the plurality of vertical structures before forming the interconnection conductive material.

9. The method of claim 8, wherein forming the plurality of vertical structures includes removing all of a hard mask over the top electrode before sealing the vertical structures with the dielectric material.

10. The method of claim 8, wherein etching the dielectric material to expose the respective top electrodes of the plurality of vertical structures includes etching the formed dielectric material to expose up to one half of a thickness of the respective top electrodes of the plurality of vertical structures.

11. The method of claim 10, wherein forming the plurality of vertical structures each having the top electrode includes forming each top electrode of the plurality of vertical structures to have a sufficient thickness such that up to one half of a thickness of the respective top electrodes of the plurality of vertical structures can be exposed without exposing the memory element or switch element underlying the top electrode.

12. The method of claim 1, wherein the reference level is a substrate, and wherein forming the plurality of vertical structures includes forming the plurality of vertical structures over the substrate.

13. The method of claim 1, wherein controlling termination of CMPing the dielectric material at least partially responsive to detecting the interconnection conductive material.

14. The method of claim 1, further comprising:
forming a chop mask over a first portion of the plurality of vertical structures and not over a second portion of the plurality of vertical structures;
performing a chop etch of the second portion of the plurality of vertical structures,
wherein forming the dielectric material over the interconnection conductive material and over the reference level adjacent the plurality of vertical structures includes forming the dielectric material over the first and second portions of the plurality of vertical structures, the reference level being located adjacent second portion of the plurality of vertical structures.

15. The method of claim 14, wherein forming the interconnection conductive material between the respective top electrodes of the plurality of vertical structures includes forming a uniform thickness of the interconnection conductive material over the vertical structures and over the reference level adjacent the plurality of vertical structures; and
wherein CMPing the dielectric material includes CMPing the interconnection conductive material.

16. An array of memory cells formed according to the method of claim 1.

17. A method for forming an array of memory cells, comprising:
forming a plurality of vertical structures each having a switch element in series with a memory element in series with a top electrode;
sealing the vertical structures with dielectric material formed between and over the plurality of vertical structures;
forming an interconnection conductive material between the respective top electrodes of the plurality of vertical structures;
etching-back the interconnection conductive material;
forming a conductive material over the interconnection conductive material;
etching-back the conductive material; and
forming a conductive line over the interconnection conductive material after etching-back the conductive material;
wherein etching-back the interconnection conductive material includes etching-back the dielectric material to a lower elevation than adjacent vertical structures so as to expose the respective top electrodes of the plurality of vertical structures before forming the interconnection conductive material.

18. The method of claim 17, wherein etching-back the conductive material includes removing all of the conductive material.

19. The method of claim 17, wherein forming a plurality of vertical structures includes removing all of a hard mask over the top electrode before sealing the vertical structures with the dielectric material.

20. The method of claim 17, wherein etching the dielectric material to expose the respective top electrodes of the plurality of vertical structures includes etching the dielectric material to expose up to one half of a thickness of the respective top electrodes of the plurality of vertical structures.

21. The method of claim 17, wherein forming the plurality of vertical structures each having the top electrode includes forming each top electrode of the plurality of vertical structures to have a sufficient thickness such that up to one half of a thickness of the respective top electrodes of the plurality of vertical structures can be exposed without exposing the memory element or switch element underlying the top electrode.

22. The method of claim 17, further comprising:
forming a second dielectric material over the interconnection conductive material and over a reference level adjacent the plurality of vertical structures; and
chemical mechanical polishing (CMPing) the second dielectric material to remove the second dielectric material from over the interconnection conductive material.

23. The method of claim 22, wherein forming the plurality of vertical structures includes forming the plurality of vertical structures over the reference level, and wherein the reference level is a substrate.

24. An array of memory cells formed according to the method of claim 17.

25. A method for forming an array of memory cells, comprising:
forming a stack of materials over a substrate that includes a material corresponding to a top electrode over a material corresponding to a memory element over a material corresponding to a middle electrode over a material corresponding to a switch element over a material corresponding to a bottom electrode over a material corresponding to a first conductive line;
patterning a hard mask over the stack of materials;
etching the stack of materials into vertical structures according to the patterned hard mask;
forming a first dielectric material over the vertical structures;
dry etching the first dielectric material to expose up to one half of the top electrode of each of the vertical structures and until a portion of the substrate not between the vertical structures is exposed;
forming interconnecting conductive material between and over the top electrode of each of the vertical structures and over the exposed portion of the substrate not between the vertical structures; and
dry etching the interconnecting conductive material until the portion of the substrate not between the vertical structures is re-exposed,
wherein etching the stack of materials include removing the hard mask from the vertical structures.

26. The method of claim 25, further comprising:
forming a second dielectric material over the dry-etched interconnecting conductive material;
removing a portion of the second dielectric material to expose the dry-etched interconnecting conductive material;
forming a conductive material over the exposed dry-etched interconnecting conductive material; and
removing the conductive material formed over the interconnecting conductive material such that the conductive material remains on first portions of the interconnecting conductive material and the conductive material is removed from second portions of the interconnecting conductive material by chemical-mechanical polishing techniques; and
forming material corresponding to a second conductive line over the conductive material and the interconnecting conductive material.

27. An array of memory cells formed according to the method of claim 26.

* * * * *